(12) United States Patent
Sato et al.

(10) Patent No.: US 6,407,374 B1
(45) Date of Patent: Jun. 18, 2002

(54) TWO-DIMENSIONAL ARRAY TYPE DETECTING DEVICE HAVING A COMMON AND INDIVIDUAL ELECTRODES

(75) Inventors: Toshiyuki Sato, Kyoto; Satoshi Tokuda, Kusatsu; Kenji Sato, Otsu; Junichi Suzuki, Kyoto; Shinya Hirasawa, Uji; Naoyuki Hori, Kyoto-fu; Toshinori Yoshimuta, Takatsuki; Hidetoshi Kishimoto, Izumi, all of (JP)

(73) Assignee: Shimadzu Corporation, Kyoto (JP)

( * ) Notice: Subject to any disclaimer, the term of this patent is extended or adjusted under 35 U.S.C. 154(b) by 119 days.

(21) Appl. No.: 09/650,846

(22) Filed: Aug. 29, 2000

(30) Foreign Application Priority Data

Sep. 6, 1999 (JP) ............................................ 11-251206

(51) Int. Cl.[7] ................................................ H01L 27/00
(52) U.S. Cl. .................................. 250/208.1; 250/214 R
(58) Field of Search ........................ 250/208.1, 214 R, 250/214.1, 370.18, 370.14, 363.04, 363.1; 257/432–436; 348/302, 304, 308

(56) References Cited

U.S. PATENT DOCUMENTS 6,322,475 B2 * 11/2001 Spartiotis et al. ........ 250/208.1

* cited by examiner

*Primary Examiner*—Que T. Le
(74) *Attorney, Agent, or Firm*—Kanesaka & Takeuchi

(57) ABSTRACT

A two-dimensional array type detecting device of the invention is formed of a detecting side substrate, and a readout side substrate laminated together. In the detecting side substrate, a high resistivity responsive semiconductor film is laminated on a substrate through a common electrode therebetween, and semiconductor films for connection are formed for the respective sections corresponding to a two-dimensional array arrangement. Therefore, leak and expansion of carriers produced in the high resistivity responsive semiconductor are prevented in a direct conversion system, wherein light or radiation enters from a side of the glass substrate, in which the common electrode is not formed. Thus, a detecting sensitivity and space resolution can be improved. Namely, a dynamic range is large, and a crosstalk is small.

8 Claims, 4 Drawing Sheets

TWO-DIMENSIONAL ARRAY TYPE DETECTING DEVICE HAVING A COMMON AND INDIVIDUAL ELECTRODES

BACKGROUND OF THE INVENTION AND RELATED ART STATEMENT

The invention relates to a two-dimensional array type detecting device, which is a direct conversion type and includes a responsive semiconductor film for directly converting light or radiation to carriers. The invention also relates to a technology for improving a detecting sensitivity and a space resolution.

In recent years, a two-dimensional array type detecting device for detecting light or radiation is used for medical purposes or industrial purposes. As shown in FIG. 8, in a conventional two-dimensional array type detecting device 51, a large number of detecting elements 51a is arranged in order vertically and horizontally according to a two-dimensional array arrangement, and at the same time, elements, not shown, for storing and reading out carriers (electrons or positive holes) produced in the detecting elements 51a by the light or radiation as the object to be detected are disposed to correspond to the two-dimensional array arrangement of the detecting elements 51a, to thereby collect the produced carriers for each element.

In case of the two-dimensional array type detecting device 51 for detecting light, an amorphous silicon (a-Si) film for photodiode is used as a responsive semiconductor film, which produces carriers by responding to the light as the object to be detected or detecting object. Also, in case of the two-dimensional array type detecting device 51 for detecting radiation, such as x-ray, an amorphous selenium (a-Se) film is used as a responsive semiconductor film, which produces carriers by responding to the radiation as the detecting object. Since these detecting devices include the responsive semiconductor films which directly convert light or radiation as the detecting object into the carriers, the devices are called a direct conversion type.

Incidentally, in case of the detecting device for detecting radiation, there can be used a device of an indirect conversion type for indirectly detecting radiation in a two-step structure formed of a phosphor or fluorescent member, such as a CsI (cesium iodide) layer generating light by responding to radiation as the detecting object, and an Si (silicon) layer for photodiode producing carriers by responding to the generated light. In the detecting device of the indirect conversion type, however, since there is a connection loss between the CsI layer and Si layer in addition to the photoelectric transfer loss, the indirect conversion type detecting device is disadvantageous in the detecting sensitivity as compared to the detecting device of the direct conversion type. Also, the detecting device of the indirect conversion type has a disadvantage in the space resolution since there is caused a diffusion of light in the lateral direction of the film.

However, even in the two-dimensional array type detecting device of the direct conversion type, there is a problem that the detecting sensitivity and the space resolution are not high enough. Since the detecting element at a position of generating carriers is not able to collect enough carriers due to leakage and scattering of the carriers, which are produced in the responsive semiconductor film by incidence of light or radiation as the detecting object, the detecting sensitivity and the space resolution are low. If the detecting sensitivity and the space resolution are not sufficient, there is a disadvantage such that, for example, an image quality of a two dimensional image formed based on the detecting signals is deteriorated. Therefore, it has been strongly desired to improve the sensitivity and resolution.

The present invention has been made in view of the foregoing, and an object of the invention is to provide a two-dimensional array type detecting device of a direct conversion type, in which the detecting sensitivity and the space resolution are improved.

Further objects and advantages of the invention will be apparent from the following description of the invention.

SUMMARY OF THE INVENTION

To achieve the aforementioned objects, a first aspect of the present invention provides a two-dimensional array type detecting device which comprises a detecting side substrate and a readout side substrate. The detecting side substrate is formed of a common electrode formed on a front surface of a support substrate; a responsive semiconductor film, which is laminated on a front surface side of the common electrode and produces carriers by responding to light or radiation as the detecting object; semiconductor films for junction, which are formed on a front surface of the responsive semiconductor film for the respective sections corresponding to a two-dimensional array layout or arrangement to have hetero-junctions with the responsive semiconductor film; and individual electrodes respectively formed on front surfaces of the semiconductor films for junction. The readout side substrate is formed of a large number of storing elements for storing the produced carriers and a large number of reading elements for reading the carriers, which are respectively formed on a circuit board in a layout corresponding to the two-dimensional array layout in the detecting side substrate. In the detecting device, the detecting side substrate and the readout side substrate are joined such that the respective reading elements are electrically connected to the respective individual electrodes, and light or radiation enters from a side of the support substrate, in which the common electrode is not formed.

Further, a two-dimensional array type detecting device according to a second aspect of the invention comprises a detecting side substrate and a readout side substrate. The detecting side substrate is formed of a common electrode formed on a front surface side of a support substrate; a responsive semiconductor film, which is laminated on a front side of the common electrode and produces carriers by responding to light or radiation as the detecting object; and individual electrodes, which are formed on a front surface of the responsive semiconductor film for the respective sections corresponding to a two-dimensional array layout or arrangement, wherein the individual electrodes have Schottky junctions with the responsive semiconductor film. The readout side substrate is formed of a large number of storing elements for storing the produced carriers and a large number of reading elements for reading the carriers, which are respectively arranged on a circuit board in a layout corresponding to the two-dimensional array layout in the detecting substrate. In the detecting device, the detecting side substrate and the readout side substrate are joined such that the respective reading elements are electrically connected to the respective individual electrodes, and light or radiation enters from a side of the support substrate, in which the common electrode is not formed.

Still further, a two-dimensional array type detecting device according to a third aspect of the invention comprises a detecting side substrate and a readout side substrate. The detecting side substrate is formed of a common electrode formed on a front surface of a support substrate; a responsive semiconductor film with high resistivity laminated on a front side of the common electrode and responds to light or radiation as the detecting object to produce carriers; and individual electrodes, which are formed on a front surface of the responsive semiconductor film for the respective sections corresponding to a two-dimensional array layout. The readout side substrate includes a large number of storing elements for storing the produced carriers and a large number of reading elements for reading the carriers, which are respectively formed on a circuit board in a layout corresponding to the two-dimensional array layout in the detecting side substrate. In the detecting device, the detecting side substrate and the readout side substrate are joined such that the respective reading elements for reading the carriers are electrically connected to the respective individual electrodes, and light or radiation enters from a side of the support substrate, in which the common electrode is not formed.

Also, according to a fourth aspect of the invention, in the aforementioned detecting devices, the detecting side substrate can be provided with a semiconductor film for junction which is interposed between the responsive semiconductor film and the common electrode to have hetero-junctions with the responsive semiconductor film.

Next, operations of the two-dimensional array type detecting devices according to the invention will be explained.

In case of the two-dimensional array type detecting device according to the first aspect of the invention, light or radiation as the detecting object entering from the side of the support substrate, in which the common electrode is not formed, enters into the responsive semiconductor film to produce the carriers (electrons or positive holes) by the direct conversion system, and the produced carriers are collected at the respective individual electrodes, that is, carrier collecting electrodes. Then, in the two-dimensional array type detecting device according to the first aspect of the invention, the front surface of the responsive conductor film is provided with the responsive semiconductor films for junction, which respectively have the hetero-junctions with the responsive semiconductor film and are arranged for the respective sections corresponding to the two-dimensional array layout, so that leak and expansion of the produced carriers can be prevented. Thus, since the carriers are collected at the individual electrodes close to the producing position, the detecting sensitivity and the space resolution can be improved. Namely, a dynamic range is large, and a crosstalk is small.

In case of the two-dimensional array type detecting device according to the second aspect of the invention, light or radiation as the detecting object entering from the side of the support substrate, in which the common electrode is not formed, enters the responsive semiconductor film to produce the carriers (electrons or positive holes) by the direct conversion system, and at the same time, the produced carriers are collected at the respective individual electrodes as the carrier collecting electrodes. Then, in the two-dimensional array type detecting device according to the second aspect of the invention, the front surface of the responsive semiconductor film is provided with the individual electrodes, which respectively have the Schottky junctions with the responsive semiconductor film and arranged thereon for the respective sections corresponding to the two-dimensional array layout, so that leak and expansion of the produced carriers can be prevented. Thus, since the carriers are collected at the individual electrodes close to the producing position, the detecting sensitivity and the space resolution can be improved. Namely, a dynamic range is large, and a crosstalk is small.

In case of the two-dimensional array type detecting device according to the third aspect of the invention, light or radiation as the detecting object entering from the side of the support substrate, in which the common electrode is not formed, enters the responsive semiconductor film with high resistivity to produce the carriers (electrons or positive holes) by the direct conversion system, and at the same time, the produced carriers are collected at the respective individual electrodes as the carrier collecting electrodes. Then, in the two-dimensional array type detecting device according to the third aspect of the invention, on the front surface of the high resistivity responsive semiconductor film, the respective individual electrodes are arranged for the respective sections corresponding to the two-dimensional array layout, so that leak and expansion of the produced carriers can be prevented. Thus, since the carriers are collected at the individual electrodes close to the producing position, the detecting sensitivity and the space resolution can be improved. Namely, a dynamic range is large, and a crosstalk is small.

In addition, in case of the two-dimensional array type detecting devices according to the first, second and third aspects of the invention, since the devices respectively have a structure such that the detecting side substrate for detecting light or radiation and the readout side substrate for storing and reading the produced carriers are manufactured separately and joined, it is prevented that the elements for storing and reading the carriers are exposed to a high heat, which is generated in case of laminating the responsive semiconductor film, and deteriorated.

In case of the two-dimensional array type detecting device according to the fourth aspect of the invention, since the semiconductor film having the hetero-junction with the responsive semiconductor film is interposed between the responsive semiconductor film and the common electrode, the produced carriers are further prevented from leaking and surely collected at the individual electrodes located close to the producing position. Accordingly, the detecting sensitivity and the space resolution are further improved.

DETAILED DESCRIPTION OF PREFERRED EMBODIMENTS

Hereunder, embodiments of the invention will be explained with reference to the attached drawings.

Figure 1:
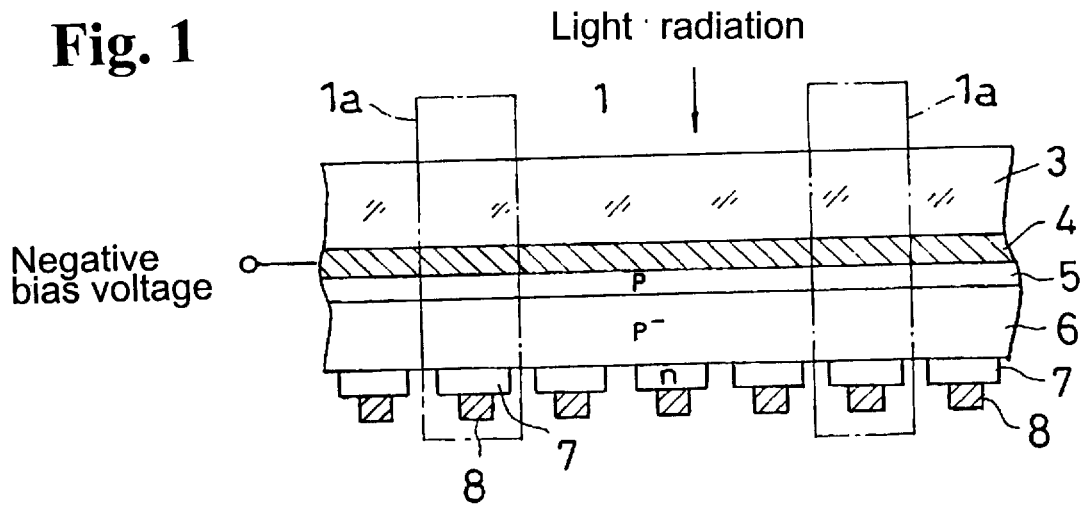
FIG. 1 is a sectional view showing a structure of a detecting side substrate in a detecting device of a first embodiment of the invention.
Figure 2:
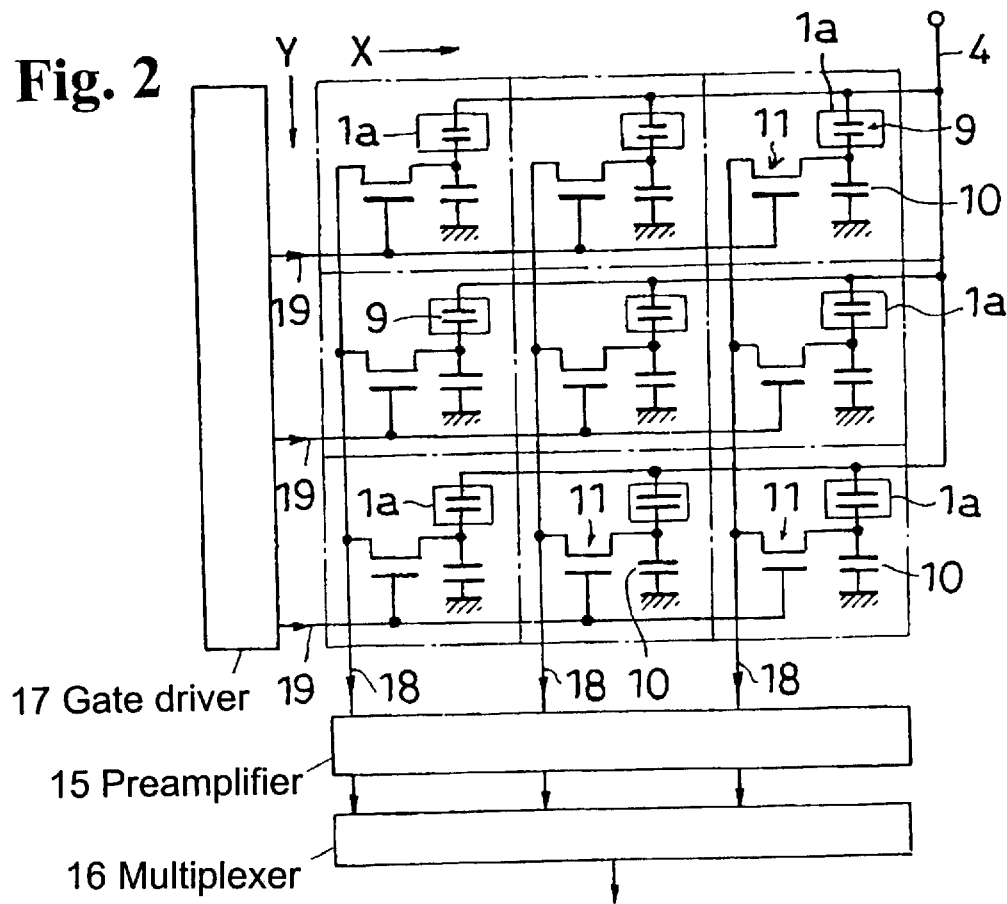
FIG. 2 is a circuit diagram schematically showing an equivalent circuit in the detecting device of the first embodiment.
Figure 3:
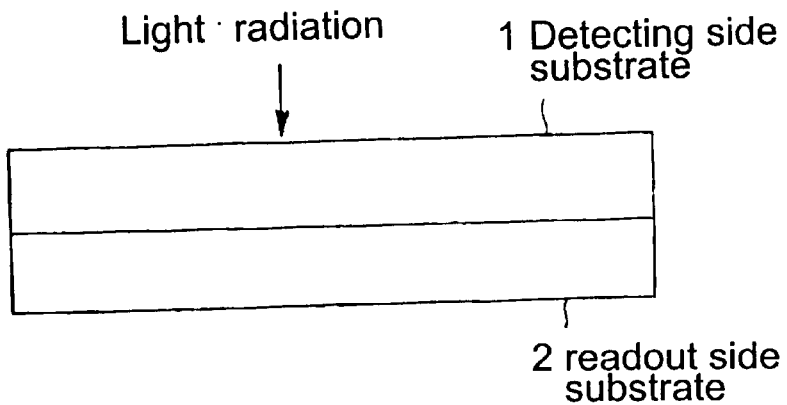
FIG. 3 is a front view showing an assembly condition of the detecting side substrate and a readout side substrate in the detecting device of the first embodiment.
Figure 4:
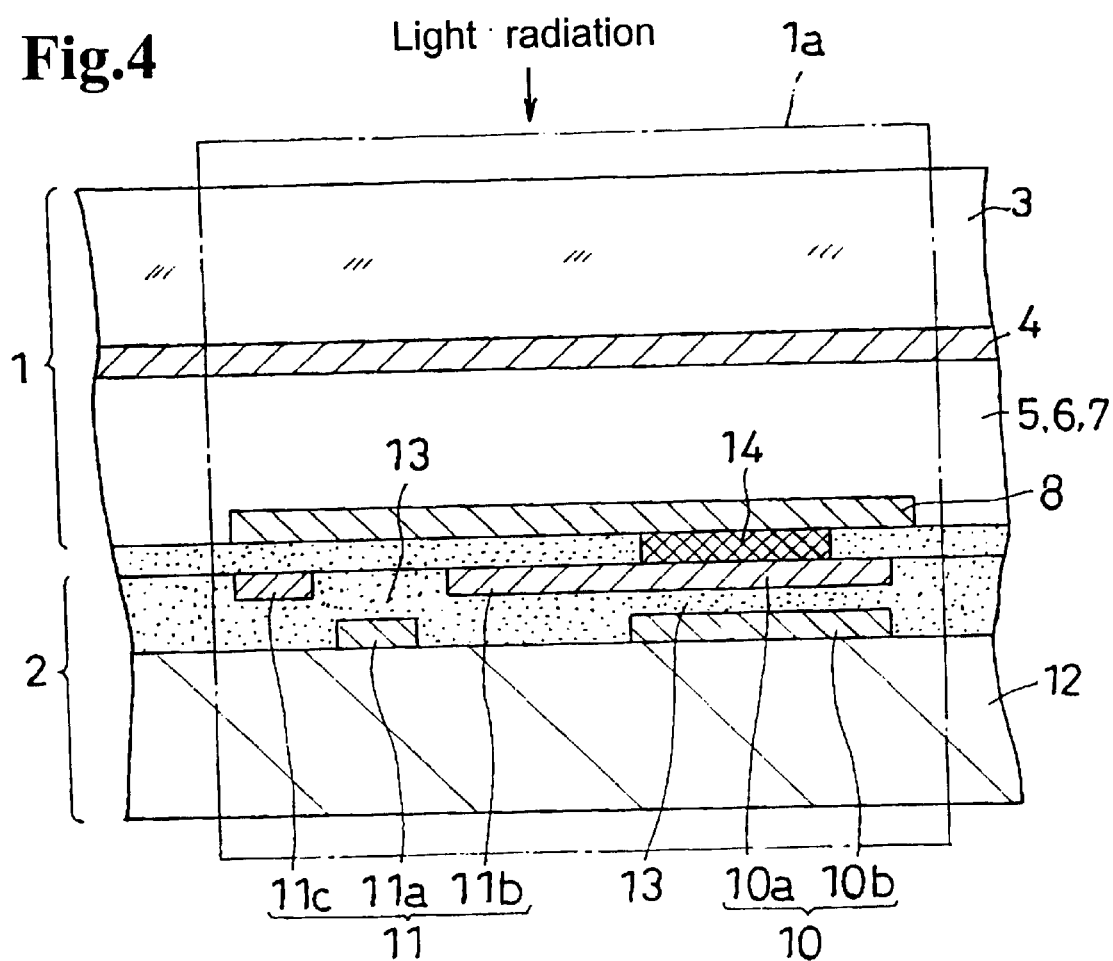
FIG. 4 is a sectional view showing a structure for one detecting element in the detecting device of the first embodiment.

FIG. 1 is a sectional view showing a structure of a detecting side substrate in a two-dimensional array type detecting device according to a first embodiment of the invention; FIG. 2 is a circuit diagram schematically showing an equivalent circuit in the two-dimensional array type detecting device according to the first embodiment of the invention; FIG. 3 is a front view showing an assembly condition of the detecting side substrate and a readout side substrate in the detecting device of the first embodiment; and FIG. 4 is a sectional view showing a structure for one detecting element in the detecting device of the first embodiment.

In the two-dimensional array type detecting device of the first embodiment, as shown in FIG. 3, a detecting side substrate (sensor matrix substrate) 1, which detects light or radiation, and a readout side substrate (active matrix substrate) 2, which stores and reads out produced carriers, are combined or joined. In the detecting side substrate 1, carriers (electrons or positive holes) are produced by irradiated light or radiation as the detecting object in a direct conversion system, and at the same time, the produced carriers are collected per element to be taken out in the readout side substrate 2. Hereinafter, structures of respective parts in the device of the first embodiment will be explained in detail.

The detecting side substrate 1 is formed of a common electrode 4, which is formed on a front surface of a water-clear glass substrate (support substrate) 3 and used for applying a bias voltage; a p-type high resistivity responsive semiconductor film 6, which is laminated on a front surface side of the common electrode 4 by interposing a p-type low resistance semiconductor film 5 therebetween, and produces carriers by responding to the light or radiation as the detecting object; n-type junction semiconductor films 7, which are formed on a front surface of the responsive semiconductor film 6 for the respective sections corresponding to a two-dimensional array layout or arrangement, and have hetero-junctions with the p-type high resistivity responsive semiconductor film 6; and individual electrodes (pixel electrodes) 8, which are formed on the respective front surfaces of the n-type junction semiconductor films 7 and provided for collecting carriers. Light or radiation as the detecting object is irradiated from a side (upper side in the figure), on which the common electrode is not formed, of the glass substrate 3.

The common electrode 4 and individual electrodes 8 are made of conductive materials, such as $In_2O_3$ (indium oxide), $SnO_2$ (tin oxide), and ITO (indium tin oxide). The p-type low resistance semiconductor film 5 is a ZnTe (zinc telluride) film. The p-type high resistivity responsive semiconductor film 6 is a $Cd_x(Zn)_{1-x}Te$ film formed by a method, such as MOCVD (metal-organic chemical vapor deposition) method, proximity sublimation method, and powder sintering method. The n-type junction semiconductor films 7 are CdS (cadmium sulfide) films.

Incidentally, the common electrode 4 has an ohmic junction with the p-type low resistance semiconductor film 5, and the individual electrodes 8 have ohmic junctions with n-type junction semiconductor films 7. Also, the common electrode 4 and the semiconductor film 5, or semiconductor films 7 and the individual electrodes 8 can be formed by film forming with a vapor deposition method or a sputtering method, or can be formed by etching with photolithography, or by patterning with lift-off.

In the detecting side substrate 1, as shown in FIGS. 1 and 2, one detecting element 1a is formed of a part of the common electrode 4, a part of the p-type low resistance semiconductor film 5, a part of the p-type high resistivity responsive semiconductor film 6, one n-type junction semiconductor film 7, and one individual electrode 8.

On the other hand, in the readout side substrate 2, as shown in FIG. 2, each of all detecting elements 1a is provided with a condenser or capacitor 10 as an element for storing electric charges (capacity), and a thin film transistor (TFT) 11 as an element for reading out. Incidentally, the condenser 10 is an equivalent capacity (detecting element capacity) between the common electrode 4 and the individual electrode 8 in each detecting element 1a.

Further, for the sake of explanation, FIG. 2 shows a matrix structure (pixel) formed of 3×3 detecting elements, i.e. total of 9 detecting elements. However, in case of the first embodiment, normally, in the detecting side substrate 1, the detecting elements 1a are arranged in a two-dimensional array layout in the matrix structure formed of 1,000×1,000 to 3,000×3,000 elements in accordance with the required number of pixels. In the readout side substrate 2, the condensers 10 of the same number as that of the pixels and the thin film transistors 11 of the same number as that of the pixels are arranged in the two-dimensional array layout with the same matrix structure.

A detailed structure of the condenser 10 and the thin film transistor 11 in the readout side substrate 2 is shown in FIG. 4. Namely, above a ground side electrode 10b of the condenser 10 and a gate electrode 11a of the thin film transistor 11, which are formed on a front surface of an insulating substrate (circuit board) 12, a connection side electrode 10a of the condenser 10, a source electrode 11b and a drain electrode 11c of the thin film transistor 11 are laminated through an insulating film 13 therebetween. In addition, except for the connection side electrode 11a, the forefront side of the electrodes is covered by the insulating film 13. Also, the connection side electrode 10a and the source electrode 11b are integrally connected to be formed simultaneously, and for example, a plasma SiN film is used as the insulating film 13, which constitutes both capacity insulating film for the condenser 10 and gate insulating film for the thin film transistor 11.

The readout side substrate 2 is manufactured by using a technology, such as thin film forming technology and fine processing technology, which are used for manufacturing an active matrix substrate for liquid crystal display. Also, by aligning the respective electrodes 8 and the connection side electrodes 10a of the condensers 10, both substrates 1 and 2 are affixed by using an anisotropic conductive film (ACF), an anisotropic conductive paste (ACP), or dry film resist (DFR), so that both substrates 1 and 2 are mechanically formed integrally. At the same time, each electrode 8 and each connection side electrode 11a are electrically connected by an intermediate conductor 14.

Further, in the readout side substrate 2, circuits for driving and reading out, that is, a preamplifier (charge-to-voltage converter) group 15, a multiplexer 16, and a gate driver 17, are disposed. As these circuits for driving and reading out, ICs (integrated circuits), such as silicon semiconductors, are used. The preamplifier group 15 is connected to a plurality of readout wires (readout address lines) 18 for a traverse or lateral (X) direction, which are respectively connected to drain electrodes of thin film transistors 11 in the same columns, and the gate driver 17 is connected to readout wires (gate address lines) 19 for a vertical (Y) direction, which are respectively connected to drain electrodes of the thin film transistors 11 in the same rows. Incidentally, in the preamplifier group 15, each readout wire 18 is connected to one individual preamplifier. Also, the respective circuits for driving and reading are connected to the readout wires 18 and 19 through amorphous conductive films (ACF) or the like.

As described above, in the readout side substrate 2, the circuits for driving and reading out are integrally disposed to have a further integrated structure. However, all or part of the circuits for driving and reading out can be disposed separately.

Next, explanation will be made for operations of detecting light or radiation by the two-dimensional array type detecting device according to the first embodiment having the aforementioned structure.

In the device of the first embodiment, a negative (minus) bias voltage is applied to the common electrode 4. As light or radiation as the detecting object enters from the upper side of the glass substrate 3 into the p-type high resistivity responsive semiconductor film 6, carriers are produced in the responsive semiconductor film 6. In the first embodiment, since the p-type high resistivity responsive semiconductor film 6 is the $Cd_x(Zn)_{1-x}Te$ film, in which the carriers are formed even if either light or radiation is entered, both light detection and radiation detection are available. Since the thin film transistors 11 are turned off (cutoff) until the next readout timing comes, the produced carriers are stored as electric charges in the condenser 10.

In the readout side substrate 2, scanning signals for reading are sent to the multiplexer 16 and the gate driver 17. Specifying the respective detecting elements 1a is operated based on addresses (for example, 0 to 1023), which are assigned to the respective detecting elements 1a in order along the arrangement in X and Y directions, so that the scanning signals for taking out are respectively signals designating the X direction address and Y direction address.

As the voltage for readout is applied to the readout wire 19 for the Y direction from the gate driver 17 in accordance with the scanning signal in the Y direction, the respective detecting elements 1a are selected by the row. Then, in accordance with the scanning signal in the X direction, the multiplexer 16 is switched on so that the thin film transistor 11 corresponding to the detecting element (pixel) 1a, which corresponds to the selected row and column, is turned on (conducted). At the same time, the electric charges stored in the condenser 10 pass through the preamprefier group 15 and the multiplexer 16, in order, to be read out as the detecting signal (pixel signal).

After adequate image processing is made to the detecting signals which are read out as described above, the detecting signals are sent to the display, such as CRT (cathode-ray tube), liquid crystal display, or PDP (plasma display panel), to be displayed as a two-dimensional image.

In the device of the first embodiment, hetero-junction between the p-type high resistivity responsive semiconductor film 6 and the n-type junction semiconductor film 7 is formed for each detecting element 1a, and the produced carriers are difficult to leak and expand, and are collected for each detecting element by each electrode 8 which is close to the producing position, so that the detecting sensitivity and the space resolution can be improved. Namely, a dynamic range is large and crosstalk is decreased. Therefore, the image obtained based on the detecting signals from the device of the embodiment has high image quality.

In addition, since the detecting side substrate 1 and the readout side substrate 2 are manufactured separately and combined, the condenser 10 for storing the carriers and the thin film transistor 11 for reading the carriers are not exposed to high heat, which is produced in laminating the p-type high resistivity responsive semiconductor film 6, to prevent deterioration. Thus, a highly responsive $Cd_x(Zn)_{1-x}Te$ film with high absorption rate and high conversion rate, which requires a high heat at 300° C. or more in case of laminating, can be used as the p-type high resistivity responsive semiconductor film 6. If the p-type high resistivity responsive semiconductor film 6 has a high sensitivity, the space resolution can be increased by further reducing the thickness of the p-type high resistivity responsive semiconductor film 6.

Next, a two-dimensional array type detecting device of a second embodiment of the invention will be explained with reference to the drawing.

Figure 5:
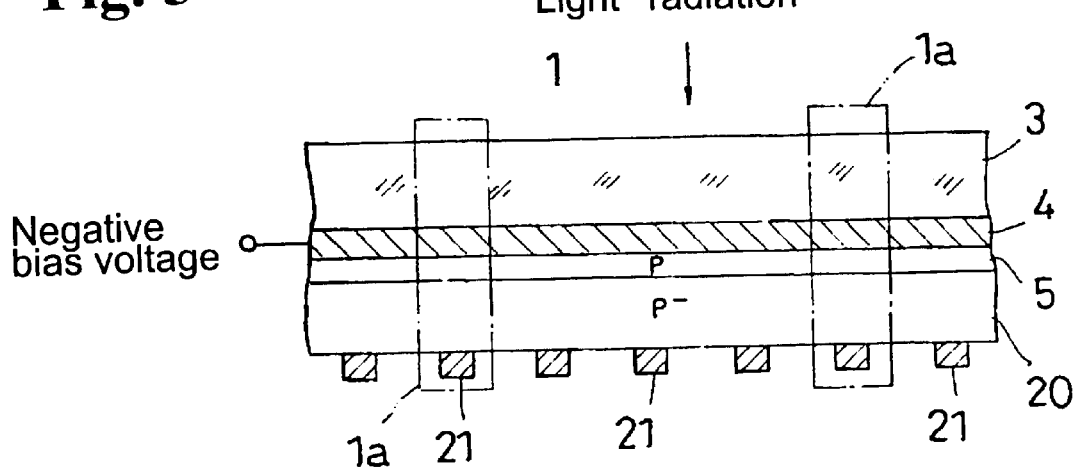
FIG. 5 is a sectional view showing a structure of a detecting side substrate in a detecting device of a second embodiment.

FIG. 5 is a sectional view showing a structure of a detecting side substrate in the two-dimensional array type detecting device of the second embodiment.

In the device of the second embodiment, in the detecting side substrate 1, a p-type high resistivity responsive semiconductor film ($Cd_x(Zn)_{1-x}Te$ film) 20 is formed on the p-type low resistance semiconductor film 5 (ZnTe film), and a front surface of the p-type high resistivity responsive semiconductor film ($Cd_x(Zn)_{1-x}Te$ film) 20 is provided with individual electrodes (pixel electrodes) 21, which are formed for the respective sections corresponding to the two-dimensional array layout to have Schottky junctions with the responsive semiconductor film 20. Other parts and structure are the same as those in the first embodiment, so that the explanations thereof are omitted herewith, and only the parts different from the first embodiment will be explained.

In the second embodiment, each electrode 21 having the Schottky junction with the responsive semiconductor film 20 is formed by using a metal material, such as In (indium) or Al (aluminum). Also, the ZnTe film of the p-type low resistance semiconductor film 5 can be a film doping with an adequate amount of other element. Further, depending on the condition of the responsive semiconductor film 20, the p-type low resistance semiconductor film 5 can be omitted.

In the two-dimensional array type detecting device of the second embodiment, Schottky junction between the responsive semiconductor film 20 and each electrode 21 is formed for each detecting element 1a to decrease leak and expansion of the produced carriers, so that the carriers are collected for each detecting element by each electrode 21 which is close to the producing position. Thus, the detecting sensitivity and the space resolution are improved. Namely, the dynamic range is large, and the crosstalk is decreased.

Also, as compared to the first embodiment, since the junction semiconductor film 7 is not necessary in the second embodiment, manufacturing is made simple.

Next, a two-dimensional array type detecting device of a third embodiment of the invention will be explained with reference to the drawing.

Figure 6:
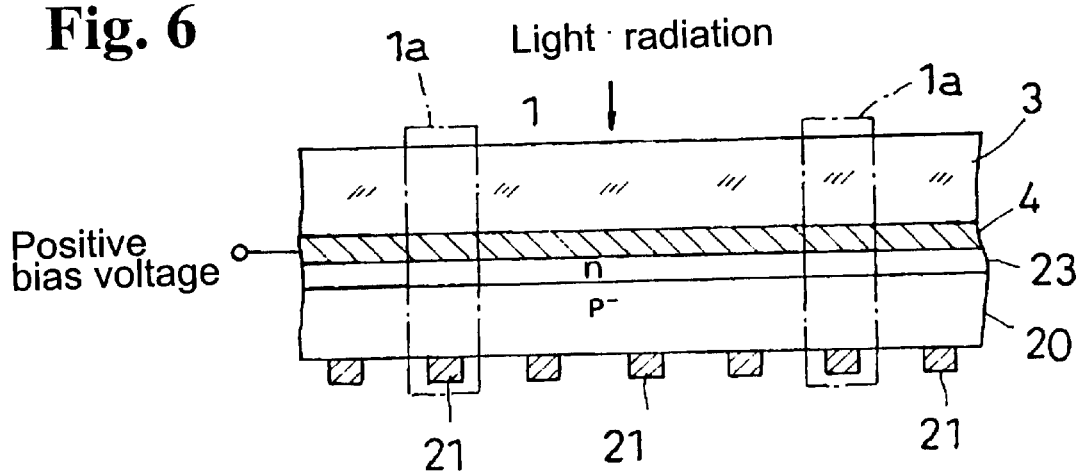
FIG. 6 is a sectional view showing a structure of a detecting side substrate in a detecting device of a third embodiment.

FIG. 6 is a sectional view showing a structure of a detecting side substrate in the two-dimensional array type detecting device of the third embodiment.

The device of the third embodiment is a modified example of the second embodiment. A structure of the third embodiment is the same as that of the second embodiment except that the device of the third embodiment is provided with an n-type semiconductor film (CdS film) 23 instead of the p-type low resistance semiconductor film 5 (ZnTe film). Therefore, the explanation for the points different from the second embodiment will be made, and the explanations for the parts common to the second embodiment are omitted herewith.

In the third embodiment, a metal material, such as Au (gold) and Pt (platinum), which has a higher work function than that of the p-type high resistivity responsive semiconductor film 20, is used for the individual electrodes 21. However, the individual electrodes 21 may be a laminated structure formed of the metal material having the high work function, such as Au or Pt, and other conductive material, such as $In_2O_3$, $SnO_2$, or ITO, which does not have a high work function. Also, in the third embodiment, a positive (plus) bias voltage is applied to the common electrode 4.

In the two-dimensional array type detecting device of the third embodiment, since the hetero-junction is made between the n-type semiconductor film 23 and the p-type high resistivity responsive semiconductor film 20, leak and expansion of the produced carriers are greatly reduced, so that the detecting sensitivity and space resolution are sufficiently improved.

Figure 7:
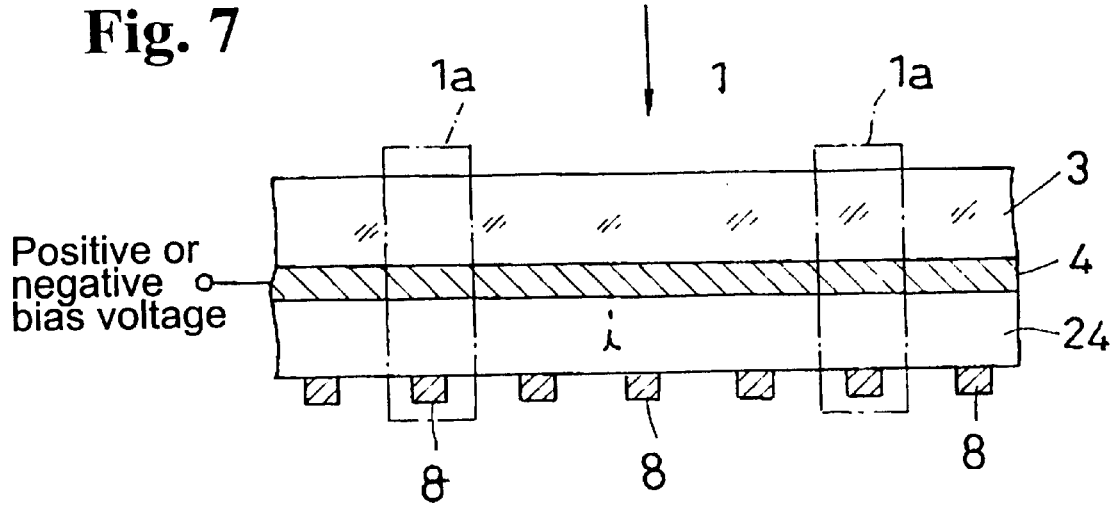
FIG. 7 is a sectional view showing a structure of a detecting side substrate in a detecting device of a fourth embodiment.
Figure 8:
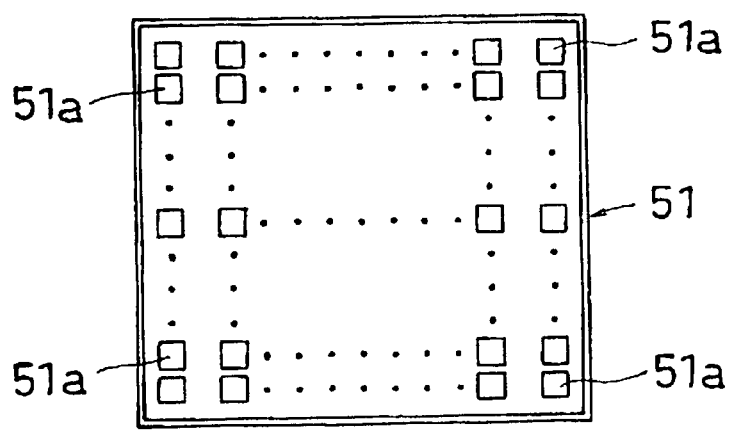
FIG. 8 is a plan view showing an array arrangement of the detecting elements in a conventional detecting device.

Finally, a two-dimensional array type detecting device of a fourth embodiment of the invention will be explained with reference to the drawing. FIG. 7 is a sectional view showing a structure of a detecting side substrate in the two-dimensional array type detecting device of the fourth embodiment.

In the device of the fourth embodiment, in the detecting side substrate 1, a responsive intrinsic semiconductor film ($Cd_x(Zn)_{1-x}Te$ film) 24, which has an ultrahigh resistivity by controlling an amount of Zn for doping, is directly formed on the front surface of the common electrode 4, and at the same time, individual electrodes 8 with a non-barrier property are directly formed on a front surface of the responsive intrinsic semiconductor film 24 for the respective sections corresponding to a two-dimensional array arrangement. Other parts of the fourth embodiment are the same as those of the first embodiment, so that the explanations thereof are omitted herewith, and only the parts different from the first embodiment will be explained.

In the fourth embodiment, the responsive intrinsic (i-type) semiconductor film 24 does not have the hetero-junction or Schottky junction, but it has an ultrahigh resistivity, so that leak and expansion of the produced carriers are small, and the produced carriers are collected for each element by each electrode 8 close to the producing position. Therefore, the detecting sensitivity and the space resolution are improved. Further, since the bias voltage applied to the common electrode 4 may be either positive or negative, the device of the fourth embodiment is easy to utilize.

Also, as compared with the first embodiment, since the semiconductor films 5 and 7 are not required, manufacturing of the device in the fourth embodiment is simplified.

The present invention is not limited to the aforementioned embodiments, and can be modified as follows.
(1) In all of the embodiments, the responsive semiconductor film is $Cd_x(Zn)_{1-x}Te$ film in which the carriers are produced when either light or radiation enters. In this modified example, however, the responsive semiconductor film may be a film producing the carriers by responding to only light or radiation, so that only the light detection or radiation detection can be carried out.

(2) In the respective two-dimensional array type detecting devices of the first, second, and fourth embodiments, the respective structures may be modified such that the semiconductor film having the hetero-junction with the responsive semiconductor film is further interposed between the common electrode and the responsive semiconductor film in the detecting side substrate as in the third embodiment.

(3) Also, as the radiation as the detecting object, X ray is exemplified in the embodiments. However, the radiation as the detecting object in the invention is not limited to X ray, and may be gamma ray. Also, light as the detecting object is not limited to visible light, and may be ultraviolet ray, or infrared ray.

As described above, according to the two-dimensional array type detecting device of the first aspect of the invention, on the responsive semiconductor film responding to light or radiation, the semiconductor films for junction having the hetero-junction with the responsive semiconductor film are formed for the respective sections corresponding to the two-dimensional array layout or arrangement, resulting in preventing leak and expansion of carriers, which are produced by the direct conversion system in the responsive semiconductor film by means of light or radiation entering from the side of the support substrate, on which the common electrode is not formed. Thus, the carriers are collected by the respective elements at the respective individual electrodes located close to the producing position, so that the detecting sensitivity and the space resolution can be improved. Namely, the dynamic range is large, and the crosstalk is small.

Further, according to the two-dimensional array type detecting device of the second aspect of the invention, on the responsive semiconductor film responding to light or radiation, individual electrodes having Schottky junctions with the responsive semiconductor film are formed for the respective sections corresponding to the two-dimensional array layout, resulting in preventing leak and expansion of carriers, which are produced by the direct conversion system in the responsive semiconductor film by means of light or radiation entering from the side of the support substrate, on which the common electrode is not formed. Thus, the carriers are collected by the respective elements at the respective individual electrodes located close to the producing position, so that the detecting sensitivity and the space resolution can be improved. Namely, the dynamic range is large, and the crosstalk is small.

Still further, according to the two-dimensional array type detecting device of the third aspect of the invention, on the high resistivity responsive semiconductor film responding to light or radiation, individual electrodes are formed for the respective sections corresponding to the two-dimensional array layout, resulting in preventing leak and expansion of carriers, which are produced by the direct conversion system in the responsive semiconductor film by means of light or radiation entering from the side of the support substrate, on which the common electrode is not formed. Thus, the carriers are collected by the respective elements at the respective individual electrodes located close to the producing position, so that the detecting sensitivity and the space resolution can be improved. Also, the dynamic range is large, and the crosstalk is small.

In addition, each of the two-dimensional array type detecting devices according to the first, second, and third aspects of the invention has a structure wherein the detecting side substrate for detecting light or radiation and the readout side substrate for storing and reading out the produced carriers are separately manufactured and combined. The element for storing and reading the carriers are prevented from being exposed to high heat, which is produced in case of laminating the responsive semiconductor film, so that deterioration is prevented. As a result, the highly sensitive film which requires high heat at the time of laminating can be used as the responsive semiconductor film.

Also, according to the two-dimensional array type detecting device of the fourth aspect of the invention, since the semiconductor film having a hetero-junction with the responsive semiconductor film is also provided between the responsive semiconductor film and the common electrode, leak of the produced carriers is further prevented, so that the produced carriers are surely collected at the respective individual electrodes close to the producing position. As a result, the detecting sensitivity and the space resolution are further improved.

While the invention has been explained with reference to the specific embodiments of the invention, the explanation is illustrative and the invention is limited only by the appended claims.

What is claimed is:

1. A two-dimensional array type detecting device, comprising:

a detecting side substrate including a support substrate having one surface and the other surface from which at least one of light and radiation as an object to be detected enters; a common electrode formed on said one surface of the support substrate; a responsive semiconductor film formed on the common electrode and producing carriers by responding to the at least one of the light and the radiation; and individual electrodes disposed on a front surface of the responsive semiconductor film for respective sections corresponding to a two-dimensional array arrangement, and a readout side substrate including a circuit board; and a plurality of storing elements for storing produced carriers and a plurality of reading elements connected to the respective storing elements for reading the carriers, both elements being formed on the circuit board corresponding to the two-dimensional array arrangement in the detecting side substrate, said readout side substrate and said detecting side substrate being joined together such that each of said reading elements is electrically connected to each of the individual electrodes.

2. A two-dimensional array type detecting device according to claim 1, wherein said responsive semiconductor film is a high resistivity responsive semiconductor film.

3. A two-dimensional array type detecting device according to claim 2, wherein each of said individual electrodes has a work function higher than that of the high resistivity responsive semiconductor.

4. A two-dimensional array type detecting device according to claim 2, further comprising connection semiconductor films, each being formed for the respective sections corresponding to the two-dimensional array arrangement and disposed between the responsive semiconductor film and each of the individual electrodes to have a hetero-junction with the responsive semiconductor film.

5. A two-dimensional array type detecting device according to claim 1, wherein each of said individual electrodes has a Schottky junction with the responsive semiconductor film.

6. A two-dimensional array type detecting device according to claim 1, further comprising a semiconductor film for junction disposed between the responsive semiconductor film and the common electrode to have a hetero-junction with the responsive semiconductor film.

7. A two-dimensional array type detecting device according to claim 1, wherein said readout side substrate further includes an insulating film disposed on the circuit board, in which said storing elements and reading elements are retained, said readout side substrate generally facing the detecting side substrate through the insulating film.

8. A two-dimensional array type detecting device according to claim 1, wherein said readout side substrate and said detecting side substrate are separately formed and then joined together.

* * * * *